(12) United States Patent
Kaguchi et al.

(10) Patent No.: US 10,802,047 B2
(45) Date of Patent: Oct. 13, 2020

(54) INSPECTION DEVICE AND INSPECTION METHOD

(71) Applicant: Mitsubishi Electric Corporation, Tokyo (JP)

(72) Inventors: Naoto Kaguchi, Tokyo (JP); Yuji Ebiike, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/316,098

(22) PCT Filed: Oct. 26, 2016

(86) PCT No.: PCT/JP2016/081776
§ 371 (c)(1),
(2) Date: Jan. 8, 2019

(87) PCT Pub. No.: WO2018/078752
PCT Pub. Date: May 3, 2018

(65) Prior Publication Data
US 2020/0141977 A1    May 7, 2020

(51) Int. Cl.
*G01R 1/073* (2006.01)
*G01R 1/04* (2006.01)
(Continued)

(52) U.S. Cl.
CPC ......... *G01R 1/073* (2013.01); *G01R 1/0441* (2013.01); *G01R 1/06722* (2013.01);
(Continued)

(58) Field of Classification Search
CPC ... G01R 1/00; G01R 1/02; G01R 1/04; G01R 1/0408; G01R 1/0416; G01R 1/0433;
(Continued)

(56) References Cited

U.S. PATENT DOCUMENTS 5,521,586 A * 5/1996 Takeshita ............. H05K 5/0286
340/635
6,155,874 A * 12/2000 Endo ..................... F16K 27/029
439/547

(Continued)

FOREIGN PATENT DOCUMENTS

| JP | S60-190876 A | 9/1985 |
| JP | S62-134579 A | 6/1987 |
| JP | H02-089377 U | 7/1990 |
| JP | 2010-020936 A | 1/2010 |

OTHER PUBLICATIONS

An Office Action mailed by the Japanese Patent Office on Oct. 1, 2019, which corresponds to Japanese Patent Application No. 2018-546995 and is related to U.S. Appl. No. 16/316,098.
(Continued)

*Primary Examiner* — Hoai-An D. Nguyen
(74) *Attorney, Agent, or Firm* — Studebaker & Brackett PC (57) ABSTRACT

An inspection device according to the invention of the present application includes a fixing plate, plural expanding and contracting portions whose one ends are fixed to the fixing plate, plural contact probes that are fixed to the other ends of the plural expanding and contracting portions respectively, and plural fixing portions which are provided to the plural contact probes respectively, wherein each fixing portion performs switching between a fixing state where an upper end of a corresponding contact probe is fixed at a first position and a releasing state where the contact probe is not fixed, the contact probe is pulled to the fixing plate by a corresponding expanding and contracting portion under the fixing state, and the upper end of the contact probe is placed at a second position closer to the fixing plate than the first position under the releasing state.

17 Claims, 10 Drawing Sheets

(51) Int. Cl.
G01R 1/067 (2006.01)
G01R 31/26 (2020.01)
G01R 31/28 (2006.01)
H01L 21/66 (2006.01)

(52) U.S. Cl.
CPC ............ G01R 31/26 (2013.01); G01R 31/28 (2013.01); H01L 22/30 (2013.01)

(58) Field of Classification Search
CPC .. G01R 1/0441; G01R 1/0466; G01R 1/0483; G01R 1/06; G01R 1/067; G01R 1/06711; G01R 1/06716; G01R 1/06722; G01R 1/073; G01R 1/07307; G01R 1/07314; G01R 1/07342; G01R 1/07378; G01R 1/07385; G01R 3/00; G01R 31/00; G01R 31/26; G01R 31/2601; G01R 31/28; G01R 31/2808; G01R 31/2851; G01R 31/2886; G01R 31/2889; G01R 31/2896; H01L 22/00; H01L 22/30
USPC .............. 324/500, 537, 538, 754.01, 754.03, 324/754.07, 756.01, 756.02, 756.03, 324/756.04, 754.05; 439/607.31, 607.32, 439/607.33
See application file for complete search history.

(56) References Cited

U.S. PATENT DOCUMENTS

| | | | |
|---|---|---|---|
| 6,819,095 B1* | 11/2004 | Dubhashi | G01R 15/207 324/117 H |
| 7,361,042 B2* | 4/2008 | Hashimoto | H01R 12/88 439/260 |
| 9,146,256 B2* | 9/2015 | Yasuta | G01R 1/067 |
| 9,335,343 B1* | 5/2016 | Cortez | G01R 1/067 |
| 2005/0200363 A1* | 9/2005 | Hasegawa | G01R 31/2805 324/523 |
| 2009/0284277 A1* | 11/2009 | Yamada | G01R 31/2891 324/754.08 |
| 2016/0356814 A1* | 12/2016 | Larisch | G01R 1/0408 |
| 2020/0116791 A1* | 4/2020 | Song | G01R 31/52 |

OTHER PUBLICATIONS

International Search Report; Written Opinion; and Notification of Transmittal of the International Search Report and the Written Opinion of the International Searching Authority, or the Declaration issued in PCT/JP2016/081776; dated Jan. 17, 2017.

* cited by examiner

INSPECTION DEVICE AND INSPECTION METHOD

FIELD

The present invention relates to an inspection device and an inspection method for a power semiconductor.

BACKGROUND

Patent Literature 1 discloses an inspection jig used for inspection of a semiconductor integrated circuit.

CITATION LIST

Patent Literature

[PTL 1] JP 2010-20936 A

SUMMARY

Technical Problem

Generally, with respect to jigs for power semiconductor devices, the jigs are designed and fabricated according to chip layouts of inspection targets in order to secure a current capacity. Therefore, as the number of types of chip layouts increases, the number of the types of jigs increases. Accordingly, the time for the designing of the jigs becomes longer, and the development cost becomes higher. Furthermore, it is necessary to store and manage the manufactured jigs. Therefore, as the number of the types of jigs increases, it becomes difficult to secure a storage place. Also, the management cost of the jigs increases.

The present invention has been made to solve the above-mentioned problems, and has a first object to obtain an inspection device that can be used in common for plural products. A second object of the present invention is to obtain an inspection method using an inspection device that can be used in common for plural products.

Solution to Problem

An inspection device according to the present invention includes a fixing plate, a plurality of expanding and contracting portions that are fixed to the fixing plate at one ends thereof, a plurality of contact probes that are fixed to the other ends of the plurality of expanding and contracting portions respectively and a plurality of fixing portions that are provided to the plurality of contact probes respectively, wherein each of the fixing portions performs switching between a fixing state where an upper end of a corresponding contact probe out of the plurality of contact probes is fixed at a first position and a releasing state where the contact probe is not fixed, the contact probe is pulled to the fixing plate by a corresponding expanding and contracting portion out of the plurality of expanding and contracting portions under the fixing state, and the upper end of the contact probe is placed at a second position closer to the fixing plate than the first position under the releasing state.

An inspection method according to the present invention includes a step of preparing an inspection device including a fixing plate, a plurality of expanding and contracting portions that are fixed to the fixing plate at one ends thereof, a plurality of contact probes that are fixed to the other ends of the plurality of expanding and contracting portions respectively and a plurality of fixing portions that are provided to the plurality of contact probes respectively, each of the fixing portions performing switching between a fixing state where an upper end of a corresponding contact probe out of the plurality of contact probes is fixed at a first position and a releasing state where the contact probe is not fixed, a fixing step of setting the plurality of fixing portions to the fixing state, a contacting step of bringing the plurality of contact probes into contact with an inspection target after the fixing step, a measuring step of measuring a current-voltage characteristic of each of the plurality of contact probes while the plurality of contact probes are brought into contact with the inspection target, a switching step of selecting a fixing portion to be switched from the fixing state to the releasing state among the plurality of fixing portions according to the current-voltage characteristic, and switching the selected fixing portion from the fixing state to the releasing state and an inspection step of bringing the plurality of contact probes into contact with the inspection target and performing inspection after the switching step, wherein the contact probe is pulled to the fixing plate by a corresponding expanding and contracting portion out of the plurality of expanding and contracting portions under the fixing state, the upper end of the contact probe is placed at a second position closer to the fixing plate than the first position under the releasing state, the contact probe whose upper end is fixed at the first position contacts the inspection target with elastic force, and the contact probe whose upper end is placed at the second position does not contact the inspection target.

Advantageous Effects of Invention

In the inspection device according to the invention of the present application, the upper end of each contact probe can be placed at the first position or the second position by the fixing portion and the expanding and contracting portion. The upper end of a contact probe to be used for inspection is fixed at the first position. Also, the upper end of a contact probe which is not used for inspection is placed at the second position. Accordingly, the inspection device can be applied to plural products by selecting a contact probe to be fixed at the first position.

In the inspection method according to the invention of the present application, a contact probe to be used for inspection is selected from current-voltage characteristics of contact probes. The upper end of the selected contact probe is fixed at the first position. Also, the upper end of a contact probe which is not used for inspection is placed at the second position. At the second position, the contact probe does not contact an inspection target. Accordingly, the inspection device can be applied to plural products.

DESCRIPTION OF EMBODIMENTS

An inspection device and an inspection method according to an embodiment of the present invention are described with reference to drawings. Identical or corresponding constitutional elements are given the same reference numerals, and the repeated description of such constitutional elements may be omitted.

First Embodiment

Figure 1:
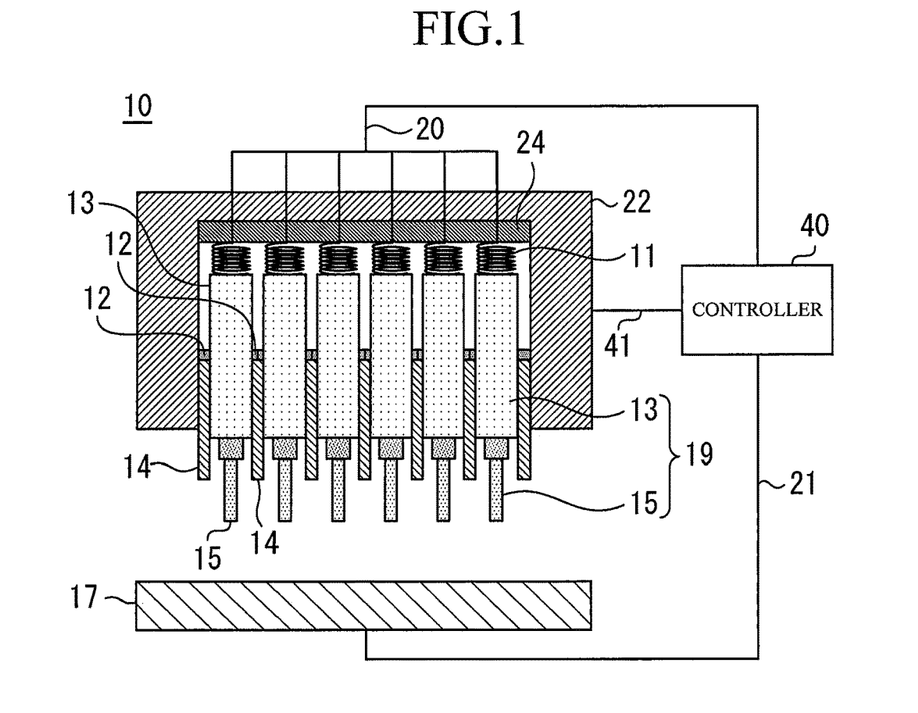
FIG. 1 is a cross-sectional view of an inspection device according to a first embodiment.

FIG. 1 is a cross-sectional view of an inspection device according to a first embodiment. The inspection device 10 includes a fixing plate 24. One ends of plural expanding and contracting portions 11 are fixed to the back surface of the fixing plate 24. In the present embodiment, the expanding and contracting portion 11 is a spring formed of metal. A contact probe 19 is fixed to the other end of each of the plural expanding and contracting portions 11.

Each contact probe 19 includes a probe pin 15 and a holding portion 13. The holding portion 13 holds and accommodates an upper part of the probe pin 15. One end of the holding portion 13 is fixed to the other end of the expanding and contracting portion 11. A lower part of the probe pin 15 is exposed from the other end of the holding portion 13. A spring (not shown) is formed at the upper part of the probe pin 15. When the probe pin 15 is pressed to the fixing plate 24, the probe pin 15 is pushed into the holding portion 13 with elastic force caused by the spring. Accordingly, the plural contact probes 19 have elasticity. Under inspection, the lower end of the probe pin 15 comes into contact with the inspection target with elastic force.

The fixing plate 24, the expanding and contracting portions 11 and the contact probes 19 are accommodated in a housing 22. The plural contact probes 19 are held by a frame portion 14. The upper part of the frame portion 14 is accommodated in the housing 22. Furthermore, the lower part of the frame portion 14 is exposed from the housing 22. Each contact probe 19 is guided by the frame portion 14 and moves up and down. In addition, the corresponding expanding and contracting portion 11 expands and contracts in association with the movement of the contact probe 19.

In the present embodiment, the expanding and contracting portion 11 has electrical conductivity. The probe pin 15 and the expanding and contracting portion 11 are electrically connected to each other. One ends of the expanding and contracting portions 11 are connected to a wiring 20 on the back surface of the fixing plate 24. The wiring 20 is connected to a controller 40. The controller 40 is a tester. A lower jig 17 is arranged below the contact probe 19. The lower jig 17 is a portion on which an inspection target is mounted. The lower jig 17 and the controller 40 are connected to each other by a wiring 21.

In the present embodiment, the contact probe 19 and the wiring 20 are electrically connected to each other by the expanding and contracting portion 11. Therefore, it is unnecessary to separately provide a member for electrically connecting the contact probe 19 and the wiring 20. Accordingly, the structure of the inspection device 10 can be simplified. On the other hand, the expanding and contracting portion 11 may be made of rubber. In this case, the durability of the expanding and contracting portion 11 can be improved. Furthermore, in this case, a member for electrically connecting the contact probe 19 and the wiring 20 is provided separately from the expanding and contracting portion 11.

Furthermore, in FIG. 1, the expanding and contracting portions 11 are in a contracted state. Each of the plural contact probes 19 is provided with a fixing portion 12. The fixing portions 12 are provided on the frame portion 14. The fixing portion 12 is a component for fixing the contact probe 19 in a state where the expanding and contracting portion 11 is expanded to arrange the contact probe 19 below a position shown in FIG. 1. Each of the fixing portions 12 fixes the corresponding contact probe 19. Furthermore, each of the fixing portions 12 is connected to the controller 40 by a wiring 41.

Figure 2:
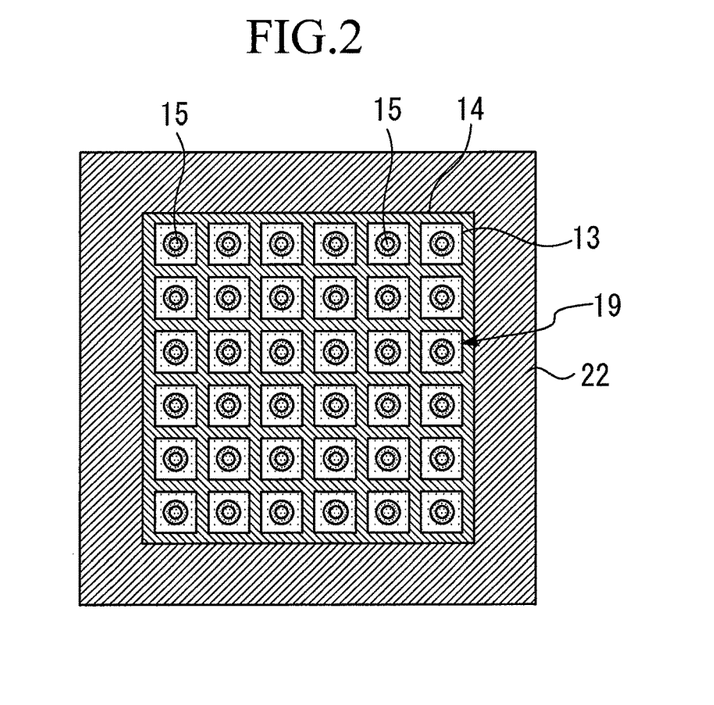
FIG. 2 is a bottom view of contact probes according to the first embodiment

FIG. 2 is a bottom view of the contact probes according to the first embodiment. Six contact probes 19 are arranged side by side in the longitudinal direction and the lateral direction in the housing 22. The inspection device 10 has thirty, six contact probes 19. The number of the contact probes 19 provided in the inspection device 10 is not limited to the above number. Furthermore, in the present embodiment, the same number of contact probes 19 are arranged in the longitudinal direction and the lateral direction, but the numbers of the contact probes 19 arranged in the longitudinal direction and the lateral direction may be different from each other.

The frame portion 14 is provided in a lattice shape so as to be filled in spaces between the adjacent contact probes 19 and between the contact probes 19 and the housing 22. Furthermore, in the present embodiment, the holding portion 13 is square in bottom view. The shape of the holding portion 13 is not limited to this shape, and it may be rectangular or circular in bottom view. In this case, it is assumed that the frame portion 14 is provided with openings each matching the shape of the holding portion 13.

Figure 3:
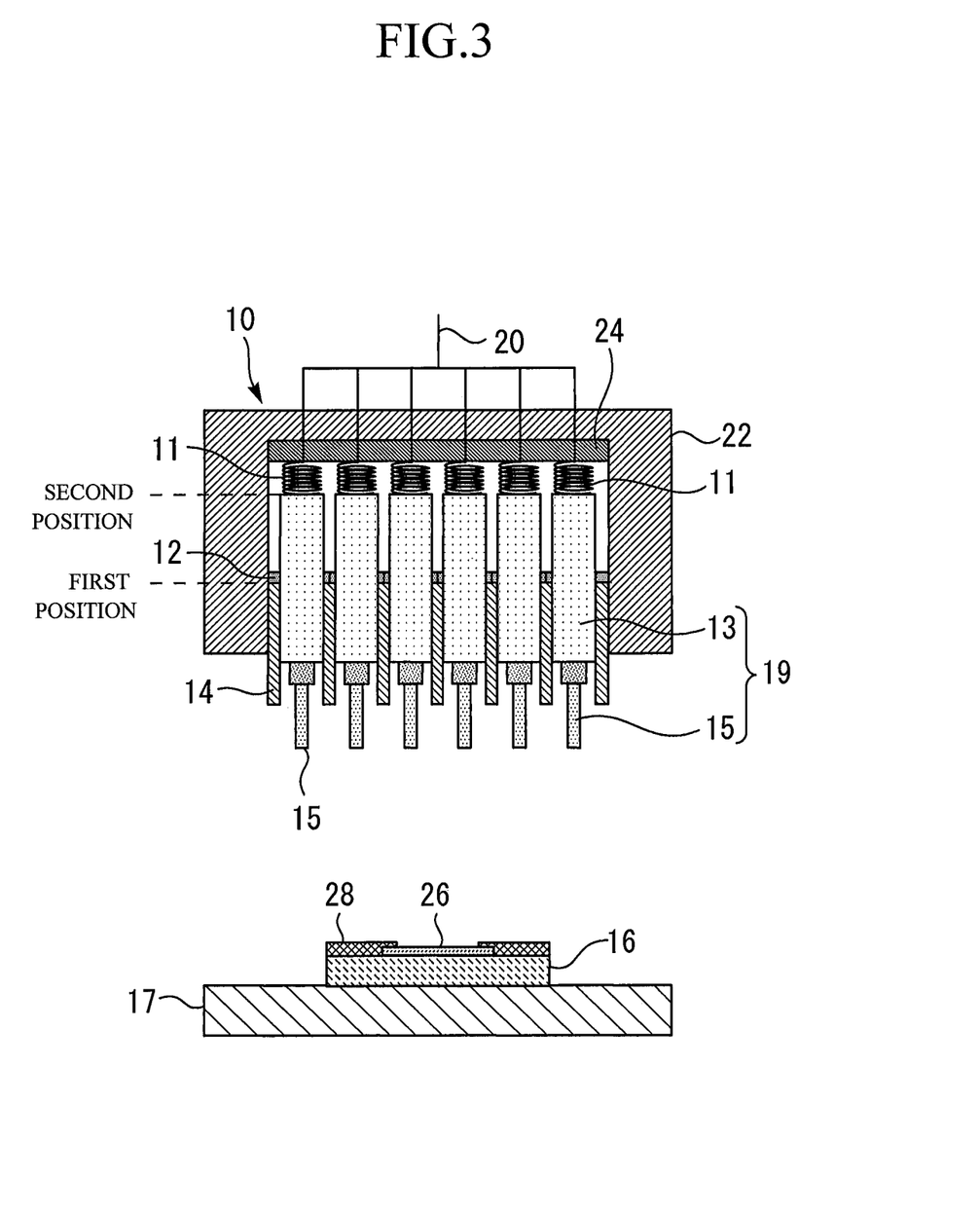
FIG. 3 is a diagram showing an inspection method according to the first embodiment.

Next, an inspection method using the inspection device 10 will be described. FIG. 3 is a diagram showing the inspection method according to the first embodiment. In FIG. 3, an inspection target 16 is placed on the upper surface of the lower jig 17. In FIG. 3, the controller 40 and the wirings 21 and 41 are omitted. The inspection target 16 is an MOSFET (Metal-Oxide-Semiconductor Field-Effect Transistor). The inspection target 16 may be a member other than the foregoing members insofar as it is a semiconductor device.

First, the inspection device 10 is prepared. At this time, the inspection target 16 is placed on the lower jig 17, and the contact probes 19 are placed above the inspection target 16. Under this state, all the expanding and contracting portions 11 are set in a contracted state, and all the contact probes 19 are accommodated in the housing 22. In FIG. 3, the inspection device 10 is in an initial state.

Figure 4:
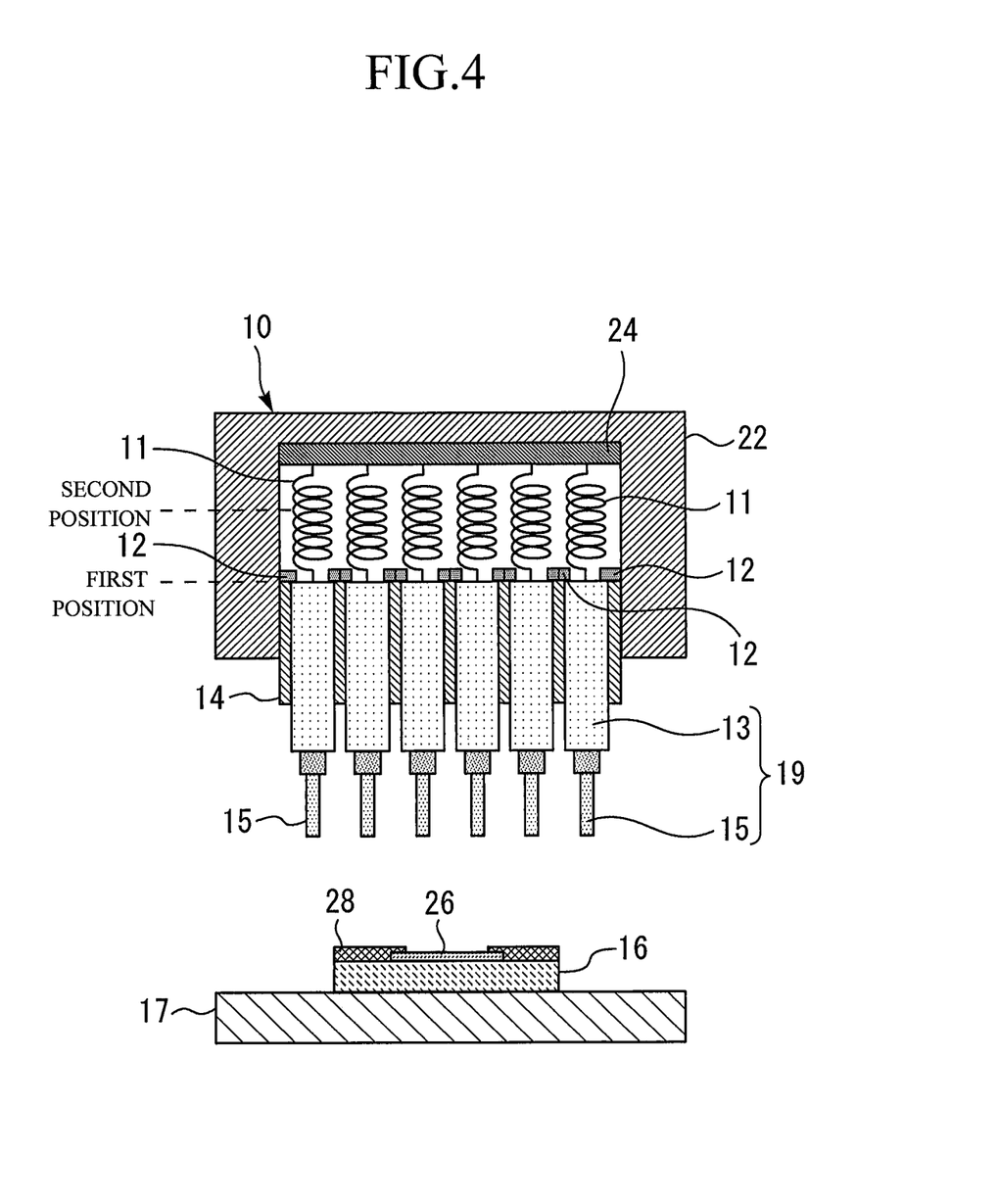
FIG. 4 is a diagram showing a fixing step according to the first embodiment.

Next, a fixing step is executed. FIG. 4 is a diagram showing the fixing step according to the first embodiment. First, all the contact probes 19 are drawn to the lower side of the housing 22. Next, the upper ends of the withdrawn contact probes 19 are fixed at the first position by the fixing portions 12. Here, the first position is a position at which the upper ends of the contact probes 19 are at the same height as the upper end of the frame portion 14.

Each fixing portion 12 is provided on both sides of each contact probe 19 and opens and closes. Each fixing portion 12 is switched between a fixing state and a releasing state. Under the fixing state, each fixing portion 12 is in a closed state with respect to the corresponding contact probe 19. Here, under the fixing state, the contact probe 19 is pulled to the fixing plate 24 by the corresponding expanding and contracting portion 11 out of the plural expanding and contracting portions 11. Under the fixing state, the fixing portion 12 is placed on the contact probe 19. Therefore, the upper end of the contact probe 19 is fixed at the first position. Accordingly, each fixing portion 12 fixes the upper end of the corresponding contact probe 19 out of the plural contact probes 19 at the first position in the fixing state.

Furthermore, under the releasing state, the fixing portion 12 is in an open state. Under the releasing state, the fixing portion 12 is accommodated on the frame portion 14, and is not placed on the contact probe 19. Accordingly, each fixing portion 12 does not fix the corresponding contact probe 19 in the releasing state. When the fixing portion 12 provided to the contact probe 19 is in the releasing state, the expanding and contracting portion 11 connected to the contact probe 19 contracts. Therefore, the upper end of the contact probe 19 is placed at the second position. The second position is a position closer to the fixing plate 24 than the first position.

In FIGS. 1 and 3, all the contact probes 19 are placed at the second position. By executing the fixing step, all the fixing portions 12 are set to the fixing state. Further, the structure of the fixing portion 12 is not limited to the above structure. It is sufficient that the fixing portion 12 may be switched between the fixing state and the releasing state so as to fix the upper end of the corresponding contact probe 19 at the first position under the fixing state while releasing the corresponding contact probe 19 from the fixing portion 12 under the releasing state.

In the present embodiment, the fixing portion 12 is provided on both sides of each contact probe 19. In contrast, the fixing portion 12 may be provided only on one side of each contact probe 19. Furthermore, in the present embodiment, the fixing portion 12 fixes the upper end of the contact probe 19, but the fixed part of the contact probe 19 may be a part other than the upper end.

Figure 5:
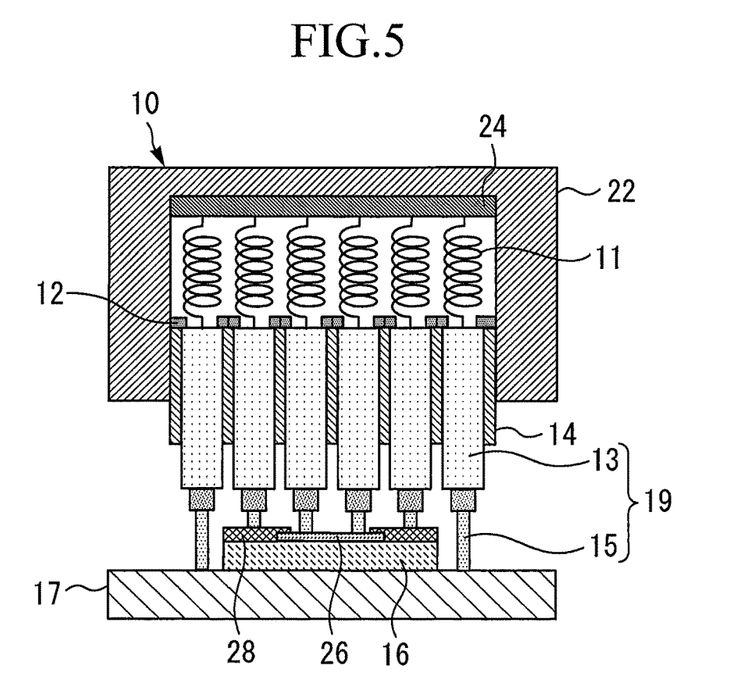
FIG. 5 is a view showing a state where the contact probes are brought into contact with the inspection target.

After the fixing step, a contacting step is executed. In the contacting step, the contact probe 19 is brought into contact with the inspection target 16. FIG. 5 is a view showing a state where the contact probes are brought into contact with the inspection target. In the present embodiment, the width of a region where the contact probes 19 are provided is larger than the width of the inspection target 16. Therefore, at least one of the plural contact probes 19 is in contact with the lower jig 17.

The contact probes 19 have elasticity. Therefore, the plural contact probes 19 can come into contact with the inspection target 16 and the lower jig 17 having top surfaces which are positionally different from each other. The probe pins 15 coming into contact with the inspection target 16 and the lower jig 17, whereby they are pushed into the holding portions 13 with elastic force. In FIGS. 4 and 5, the controller 40 and the wirings 20, 21, and 41 are omitted.

Figure 6:
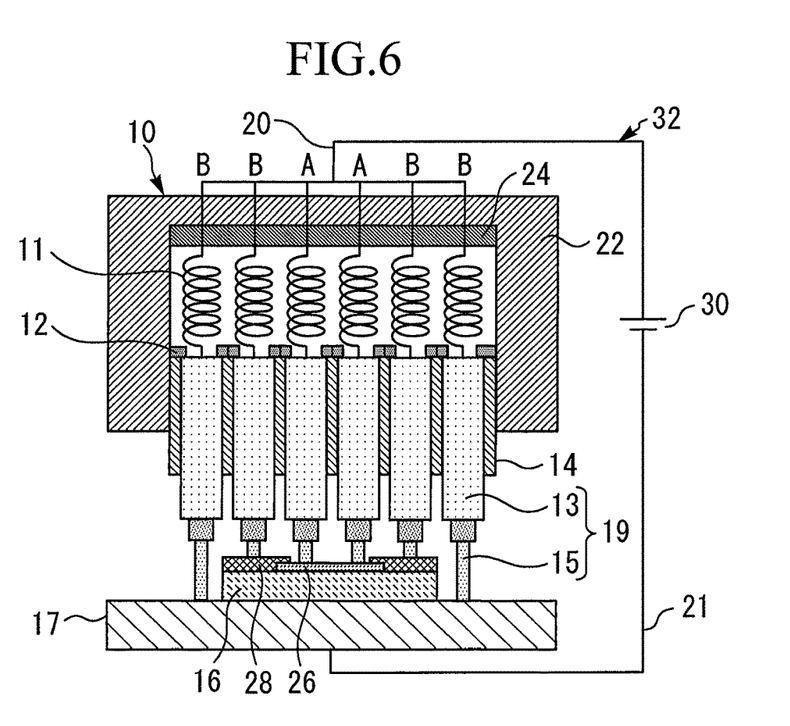
FIG. 6 is a diagram showing a measuring step according to the first embodiment.

Next, a measuring step is executed. FIG. 6 is a diagram showing the measuring step according to the first embodiment. The inspection device 10 according to the present embodiment includes a measuring circuit 32. The measuring circuit 32 includes a wiring 20, a power supply 30, and a wiring 21. The wiring 20 is connected to the wiring 21 via the power supply 30. In FIG. 6, the controller 40 is omitted. The power supply 30 may be a power supply included in the controller 40. The measuring circuit 32 is a circuit for measuring a current-voltage characteristic between each of the plural contact probes 19 and the lower jig 17.

The lower jig 17 according to the present embodiment includes plural spring probes. The plural spring probes contact the back surface of the inspection target 16 or the contact probes 19. Further, each of the spring probes is connected to the controller 40 by the wiring 21.

In the measuring step, the current-voltage characteristic of each of the plural contact probes 19 is measured while the plural contact probes 19 are brought into contact with the inspection target 16 and the lower jig 17, whereby the current-voltage characteristic between each of the plural contact probes 19 and the lower jig 17 is measured. Here, an electrode portion 26 and an insulating film 28 are formed on the upper surface of the inspection target 16. The electrode portion 26 includes, for example, a gate electrode, a drain electrode, a source electrode, or an electrode of a diode formed in MOSFET. Some of the plural contact probes 19 are in contact with the electrode portion 26. In addition, some of the plural contact probes 19 are in contact with the insulating film 28.

Figure 7:
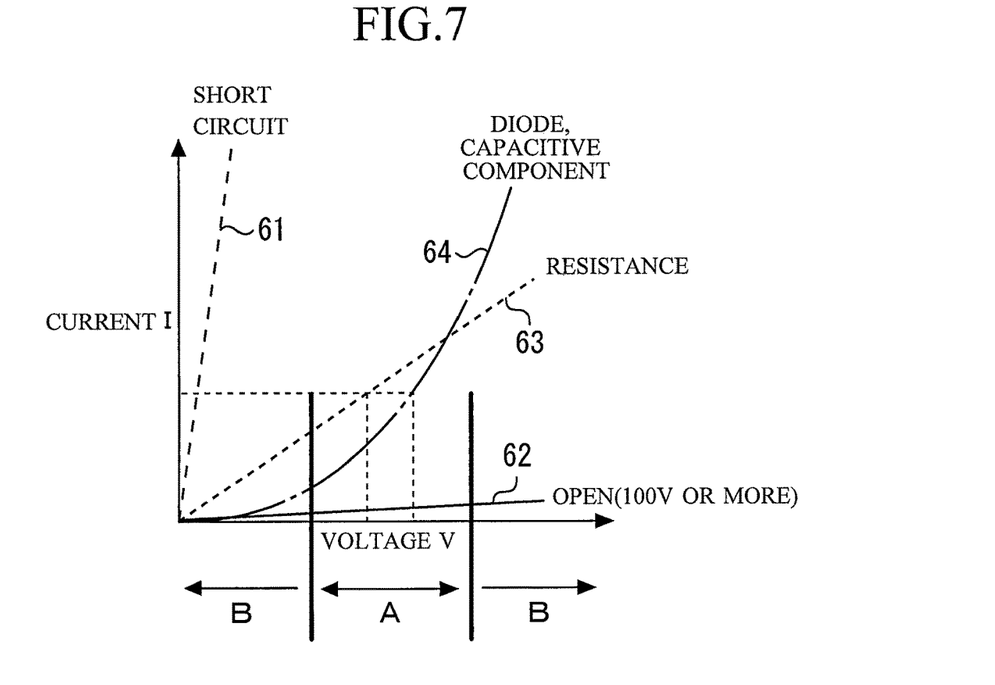
FIG. 7 is a diagram showing current-voltage characteristics of the contact probe according to the first embodiment.

FIG. 7 is a diagram showing current-voltage characteristics of the contact probe according to the first embodiment. FIG. 7 shows a measurement result of current I flowing through the contact probe 19 when a voltage V is applied between each contact probe 19 and the lower jig 17. First, a current-voltage measurement of the contact probe 19 in contact with the lower jig 17 will be described. In this case, as indicated by a broken line 61, a low resistance state is established between the contact probe 19 and the lower jig 17. Next, a current-voltage measurement of the contact probe 19 in contact with the insulating film 28 will be described. In this case, as indicated by a solid line 62, a high resistance state is established between the contact probe 19 and the lower jig 17.

Next, a case where the contact probe 19 is in contact with the electrode portion 26 will be described. In this case, the contact probe 19 and the lower jig 17 are connected to each other via a diode, a capacitive component or resistive component positioned between the electrode portion 26 and the lower jig 17. When the contact probe 19 and the lower jig 17 are connected to each other via the resistive component, the current-voltage characteristic becomes linear as indicated by a broken line 63. Furthermore, when the contact probe 19 and the lower jig 17 are connected to each other via the diode or the capacitive component, the current-voltage characteristic has a downwardly convex curved shape as indicated by a one-dot chain line 64.

When the contact probe 19 is in contact with the electrode portion 26, the resistance value between the contact probe 19 and the lower jig 17 is greater than that in a case where the contact probe 19 and the lower jig 17 are in contact with each other. In addition, the resistance value between the contact probe 19 and the lower jig 17 is smaller than that in a case where the contact probe 19 and the insulating film 28 are in contact with each other. From the foregoing, it is possible to identify a contact place of each contact probe 19 based on the difference in current-voltage characteristic among the contact probes 19. Here, the contact probe 19 in contact with the electrode portion 26 is the contact probe 19 to be used for the inspection of the inspection target 16.

Next, a switching step is executed. First, a contact probe 19 to be used for inspection is selected according to the current-voltage characteristic. In the present embodiment, a standard is set to a voltage V to be applied between the contact probe 19 and the lower jig 17 with respect to current I flowing through the contact probe 19. In the present embodiment, a contact probe 19 in which the voltage V is located in a region A shown in FIG. 7 with respect to the reference current I is used in the inspection. Also, a contact probe 19 in which the voltage V is located in regions B is not used in the inspection. In the switching step, each contact probe 19 is allocated to the region A or the region B.

A contact probe 19 in which the voltage V is lower than that in the region A is determined to be in a short-circuited state. A contact probe 19 in contact with the lower jig 17 is determined to be in a short-circuited state. Furthermore, a contact probe 19 in which the voltage V is higher than that in the region A is determined to be in an open state. A contact probe 19 in contact with the insulating film 28 is determined to be in an open state. In the present embodiment, a threshold value for the determination as to the open state is equal to 100 V.

In the present embodiment, in order to obtain the current-voltage characteristic, the voltage V is applied between each contact probe 19 and the lower jig 17 to measure the current I flowing through the contact probe 19. On the other hand, the voltage V between each contact probe 19 and the lower jig 17 may be measured while the current I is made to flow between each contact probe 19 and the lower jig 17.

In the present embodiment, a standard is set to the range of the voltage V to be applied between the contact probe 19 and the lower jig 17 with respect to the reference current value. On the other hand, a standard may be set to the range of the current I flowing through the contact probe 19 with respect to the reference voltage value.

Next, among the plural contact probes 19, the fixing portion 12 provided to the contact probe 19 which has been determined to be in the short-circuited state or the open state from the current-voltage characteristic is switched to the releasing state. That is, the fixing portion 12 provided to the contact probe 19 allocated to the region B is set to the releasing state.

Figure 8:
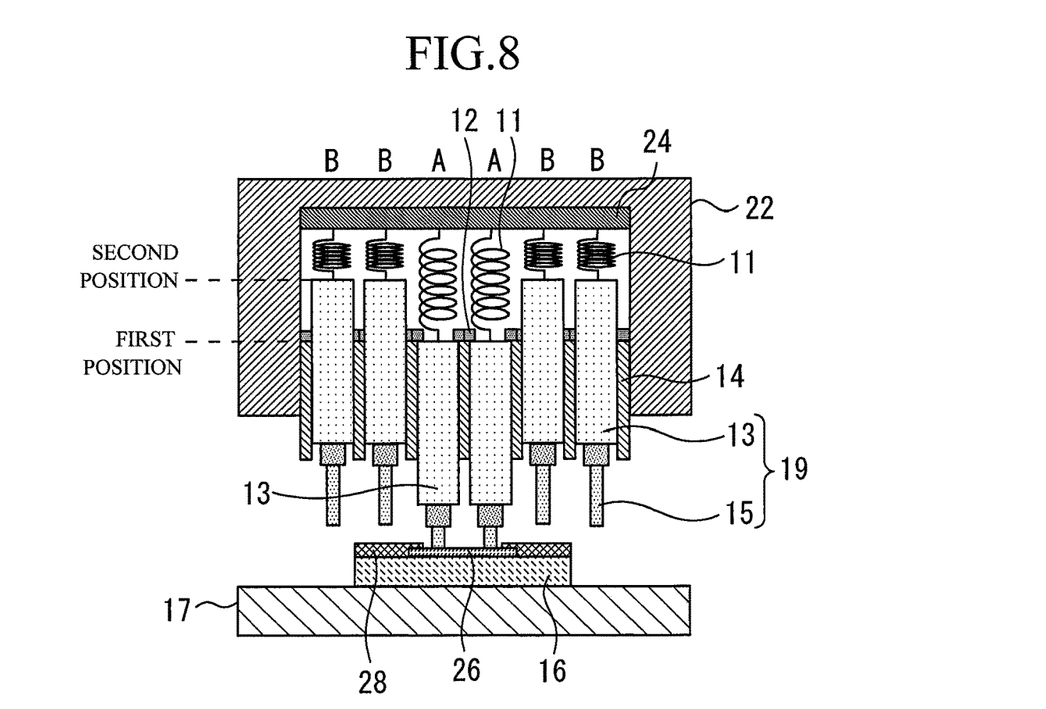
FIG. 8 is a diagram showing a state after execution of a switching step.

FIG. 8 is a diagram showing a state after the execution of the switching step. In the switching step, the fixing portion 12 to be switched from the fixing state to the releasing state among the plural fixing portions 12 is selected according to the current-voltage characteristic. The selected fixing portion 12 is switched from the fixing state to the releasing state. As a result, the contact probe 19 corresponding to the fixing portion 12 which has been set to the releasing state is pulled by the expanding and contracting portion 11, and placed at the second position. Accordingly, the contact probe 19 which is not used for inspection is accommodated in the housing 22. From the foregoing, the inspection device 10 is set in a pin arrangement corresponding to a chip layout. In FIG. 8, the controller 40 and the wirings 20, 21, and 41 are omitted.

Figure 9:
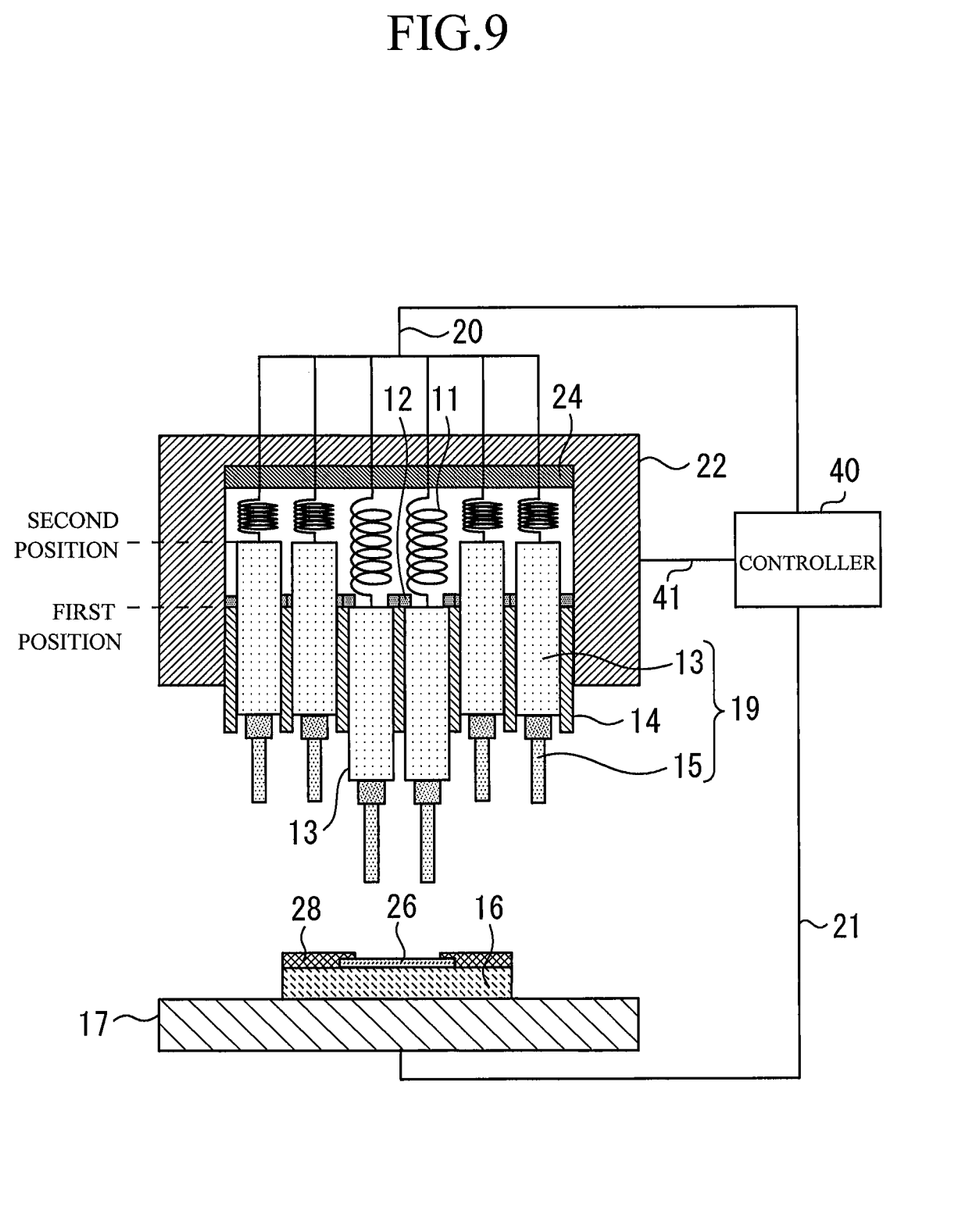
FIG. 9 is a diagram showing the inspection device for which a pin arrangement is set.

FIG. 9 is a diagram showing the inspection device for which the pin arrangement is set. The switching of the fixing portion 12 from the fixing state to the releasing state is performed by the controller 40. In the measuring step, the controller 40 measures the current-voltage characteristic between each contact probe 19 and the lower jig 17. In the switching step, the controller 40 selects the fixing portion 12 to be switched from the fixing state to the releasing state among the plural fixing portions 12 according to the current-voltage characteristic obtained in the measuring step.

The controller 40 and each fixing portion 12 are connected to each other via the wiring 41. The controller 40 emits a signal for switching from the fixing state to the releasing state via the wiring 41 to the selected fixing portion 12. In accordance with this signal, the fixing portion 12 is switched from the fixing state to the releasing state. From the foregoing, the controller 40 switches the fixing portion 12 selected according to the current-voltage characteristic from the fixing state to the releasing state. As a result, the measuring step and the switching step can be executed automatically.

Furthermore, the controller 40 stores the current-voltage characteristic for each chip layout in a storage device provided in the controller 40. The controller 40 stores which of the region A and the region B each contact probe 19 is allocated to. Furthermore, the controller 40 may store a contact probe 19 which has been determined to be in the open state or the short-circuited state. The above operation of the controller 40 can be implemented by using an existing tester as the controller 40. The switching of the fixing portion 12 from the fixing state to the releasing state may be performed manually.

Next, an inspection step is executed. In the inspection step, the plural contact probes 19 are brought into contact with the inspection target 16, and inspection is performed. Here, the upper end of the contact probe 19 for which the fixing portion 12 is in the fixing state is fixed at the first position. The upper end of the contact probe 19 for which the fixing portion 12 is in the releasing state is placed at the second position. The first position is closer to the inspection target 16 than the second position. Therefore, only the contact probe 19 fixed at the first position by the fixing portion 12 comes into contact with the inspection target 16.

Furthermore, the contact probe 19 has elasticity. Upon contact with the inspection target 16, the lower end of the probe pin 15 comes into contact with the inspection target 16 with elastic force. At this time, the probe pin 15 is pushed into the holding portion 13. Accordingly, upon contact with the inspection target 16, the contact probe 19 contracts. As shown in FIG. 8, it is assumed that the lower end of the contact probe 19 under the contracted state that is fixed at the first position at the upper end thereof is placed at a lower position than the lower end of the contact probe 19 under the expanded state that is placed at the second position at the upper end thereof. As a result, among the plural contact probes 19, only the contact probe 19 whose upper end is fixed at the first position contacts the inspection target. Furthermore, the contact probe 19 whose upper end is placed at the second position does not contact the inspection target 16.

After the inspection step is finished, all the fixing portions 12 are set to the releasing state. As a result, the inspection device 10 returns to the initial state. Accordingly, the inspection device 10 can be repeatedly used for products having layouts different from that of the inspection target 16.

When the inspection target 16 is inspected again, the controller 40 reads out the stored current-voltage characteristics after execution of the fixing step. In accordance with the stored current-voltage characteristics, the controller 40 selects fixing portions 12 to be switched from the fixing state to the releasing state among the plural fixing portions 12. As a result, at the second and subsequent inspections, the pin arrangement can be changed by reading out the current-voltage characteristics. Therefore, at the time of the second and subsequent inspections, preparation for inspection is easier.

In the inspection device 10 according to the present embodiment, the upper end of each contact probe 19 can be placed at the first position or the second position. Accordingly, plural pin arrangements can be realized by one inspection device 10. By changing the pin arrangement, the inspection device 10 can be commonly used for inspection of plural products. Common use of the inspection device 10 makes it unnecessary to develop a jig for each product. Accordingly, the development cost can be reduced. Also, even when the chip layout of products is changed, it is unnecessary to remake the jig. Therefore, it is possible to shorten the development period of products. In addition, since the number of types of jigs can be reduced, the management cost of the jigs can be reduced.

Furthermore, by adjusting the pin size of the spring probes of the lower jig 17, the inspection device 10 can be made adaptable to measurement of high current density. A high current density chip test is required for inspection of wide gap semiconductors. Accordingly, the inspection device 10 according to the present embodiment can inspect the inspection target 16 formed of a wide gap semiconductor. Here, the wide gap semiconductor is SiC, GaN or the like.

Furthermore, by adjusting the pin size of the spring probes of the lower jig 17, it is possible to flexibly deal with the chip layout of the inspection target 16. In the present embodiment, the lower jig 17 is provided with plural spring probes. On the other hand, the lower jig 17 may be provided with plural wire probes. Furthermore, the lower jig 17 may have another configuration as long as it can measure the current-voltage characteristic between the lower jig 17 and each contact probe 19.

These modifications can be applied, as appropriate, to an inspection device and an inspection method according to the following embodiments. Note that the inspection device and the inspection method according to the following embodiments are similar to those of the first embodiment in many respects, and thus differences between the inspection device and the inspection method according to the following embodiments and those of the first embodiment will be mainly described below.

Second Embodiment

Figure 10:
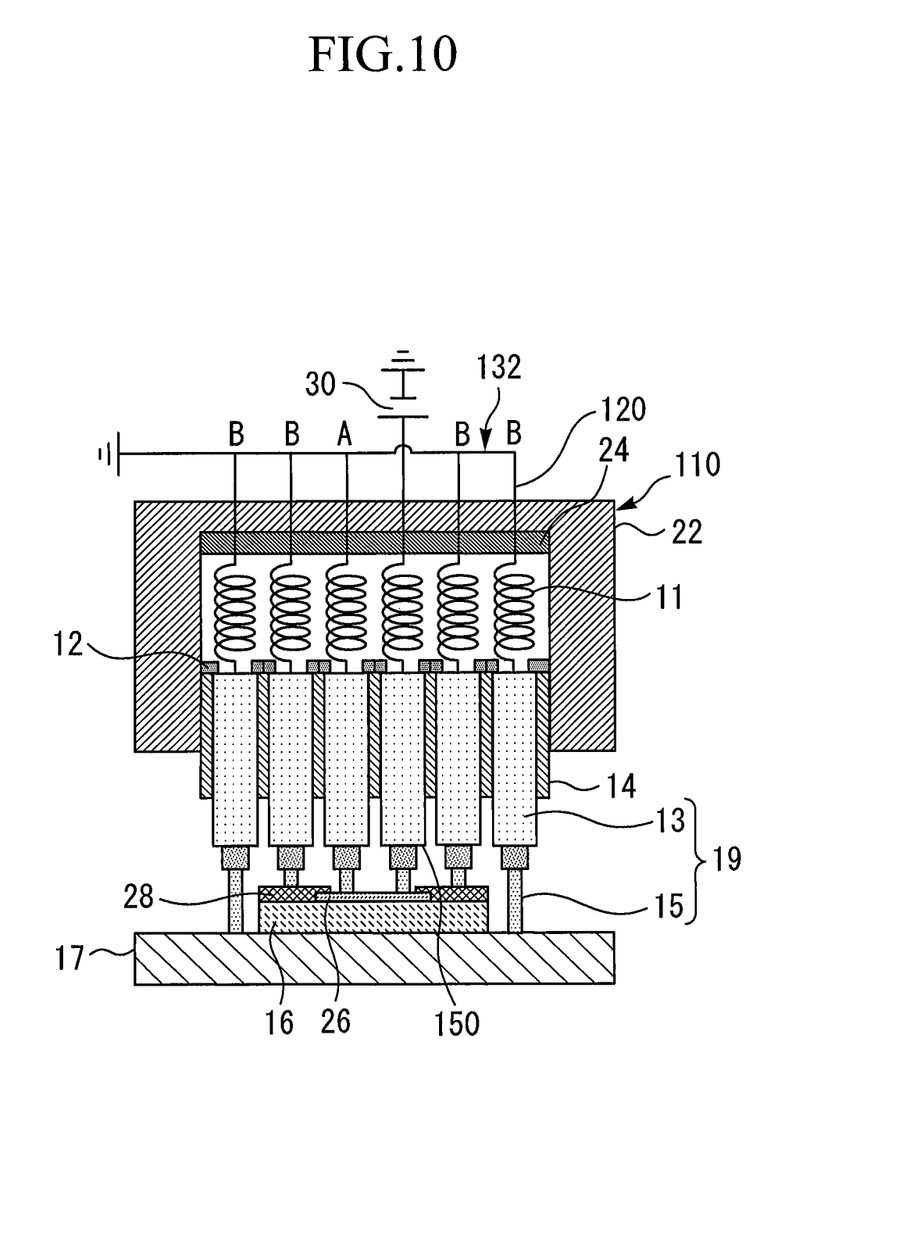
FIG. 10 is a diagram showing a measuring step according to a second embodiment.

FIG. 10 is a diagram showing a measuring step according to a second embodiment. An inspection device 110 according to the present embodiment is different from the first embodiment in the structure of a measuring circuit 132, but is the same as the first embodiment in the others. The measuring circuit 132 includes a wiring 120 and a power supply 30. In FIG. 10, the controller 40 is omitted. The power supply 30 may be a power supply included in the controller 40.

In the present embodiment, one of the plural contact probes 19 is a reference probe 150. The reference probe 150 is selected from contact probes 19 in contact with the electrode portion 26. In the present embodiment, a contact probe 19 in contact with the gate electrode of MOSFET is used as the reference probe 150. The measuring circuit 132 is a circuit for measuring the current-voltage characteristic between the reference probe 150 and each of the contact probes 19 other than the reference probe 150. The wiring 120 connects the contact probes 19 other than the reference probe 150 to the ground. The reference probe 150 is connected to the ground via the power supply 30.

Next, an inspection method using the inspection device 110 will be described. The inspection method according to the present embodiment is different from the first embodiment in the measuring step and the switching step. First, prior to the measuring step, the reference probe 150 is selected from the plural contact probes 19. In the present embodiment, the contact probe 19 in contact with the gate electrode under a state where the plural contact probes 19 are in contact with the inspection target 16 is set as the reference probe 150.

Figure 11:
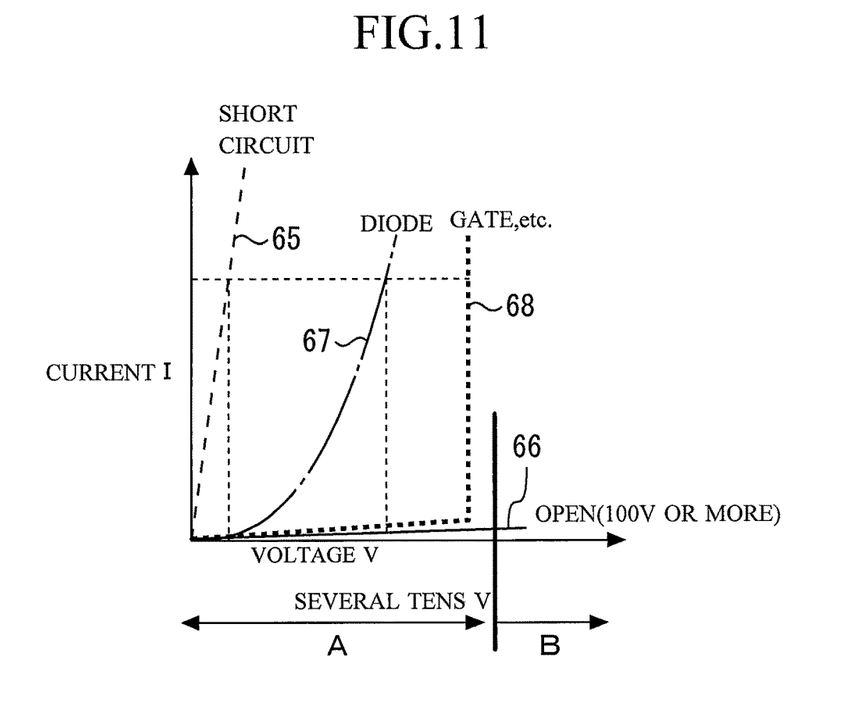
FIG. 11 is a diagram showing current-voltage characteristics of the contact probes according to the second embodiment.

In the measuring step, the current-voltage characteristic between the reference probe 150 and each of the plural contact probes 19 other than the reference probe 150 is measured. FIG. 11 is a diagram showing the current-voltage characteristics of the contact probes according to the second embodiment. FIG. 11 shows a measurement result of current I flowing through the reference probe 150 when a voltage V is applied between the reference probe 150 and each of the contact probes 19 other than the reference probe 150.

First, the current-voltage measurement of a contact probe 19 in contact with the lower jig 17 will be described. In this case, as indicated by a solid line 66, a high resistance state is established between the contact probe 19 and the reference probe 150. Next, a current-voltage measurement of a contact probe 19 in contact with the insulating film 28 will be described. In this case, as indicated by a solid line 66, a high resistance state is established between the contact probe 19 and the reference probe 150.

Next, a current-voltage measurement of the contact probe 19 in contact with the electrode portion 26 will be described. When the contact probe 19 is in contact with the same gate electrode as the gate electrode in contact with the reference probe 150, a low resistance state is established between the contact probe 19 and the reference probe 150 as indicated by a broken line 65.

Furthermore, there is a case where the contact probe 19 is in contact with the electrode of a diode formed in MOSFET. In this case, the resistance value between the contact probe 19 and the reference probe 150 is higher than that in a case where the contact probe 19 is in contact with the same gate electrode as the reference probe 150 as indicated by a one-dotted chain line 67. Furthermore, the resistance value between the contact probe 19 and the reference probe 150 is lower than that in a case where the contact probe 19 is in contact with the insulating film 28.

A dotted line 68 represents a current-voltage characteristic when the reference probe 150 contacts the drain electrode and a contact probe 19 as a measurement target comes into contact with the gate electrode as a modification of the present embodiment. In this case, MOSFET falls into a breakdown state with several tens of volts. From the foregoing, it is possible to identify a contact place of each contact probe 19 based on the difference in the current-voltage characteristic of each contact probe 19.

Next, a switching step is executed. In the present embodiment, a standard is set to a voltage V to be applied between the contact probe 19 and the reference probe 150 with respect to the current I flowing through the reference probe 150. In the present embodiment, a contact probe 19 in which the voltage V is located in a region A shown in FIG. 11 with respect to the reference current I is used in inspection. Also, a contact probe 19 in which the voltage V is located in a region B is not used in the inspection.

A contact probe 19 in which the voltage V is higher than the region A is determined to be in an open state. A contact probe 19 in contact with the insulating film 28 or the lower jig 17 is determined to be in an open state. In the present embodiment, a threshold value for determination as to the open state is equal to 100 V. A contact probe 19 in contact with the electrode portion 26 is allocated to the region A. Next, the fixing portion 12 provided to a contact probe 19 which has been determined to be in the open state from the current-voltage characteristic among the plural contact probes 19 is switched to the releasing state.

In the measuring step according to the present embodiment, the measurement between the lower jig 17 and the contact probe 19 is unnecessary. Therefore, it is unnecessary for the lower jig 17 to have a spring probe or a wire probe. Accordingly, the lower jig 17 can be simplified.

Third Embodiment

Figure 12:
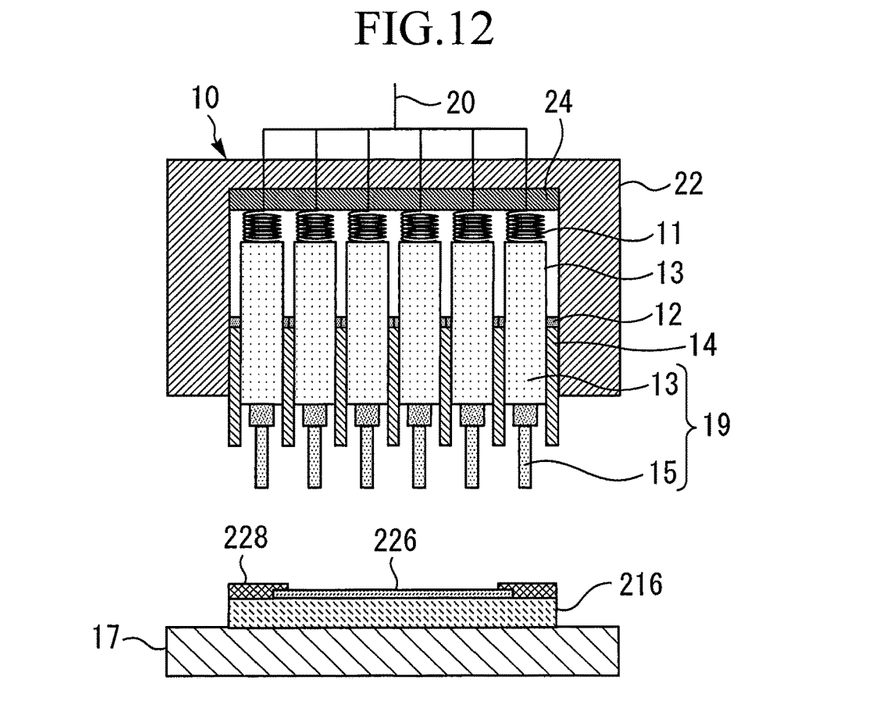
FIG. 12 is a diagram showing an initial state of an inspection device according to the third embodiment.

FIGS. 12 to 16 are diagrams showing an inspection method according to a third embodiment. In the present embodiment, the width of an inspection target 216 is larger than the width of a region where the contact probes 19 are provided. The present embodiment is the same as the first embodiment except for the foregoing matter. In the present embodiment, the plural contact probes 19 do not contact the lower jig 17. The inspection method in this case will be described. FIG. 12 is a diagram showing an initial state of an inspection device according to the third embodiment. In FIG. 12, the controller 40 and the wirings 21 and 41 are omitted.

Figure 13:
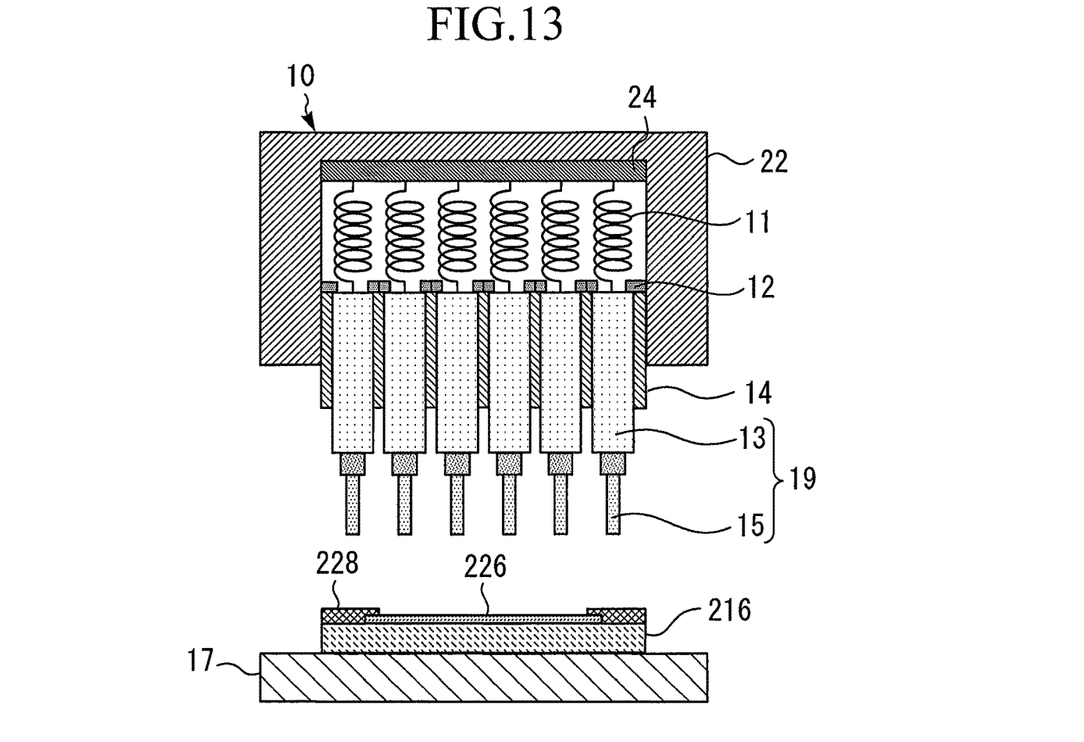
FIG. 13 is a diagram showing a fixing step according to the third embodiment.
Figure 14:
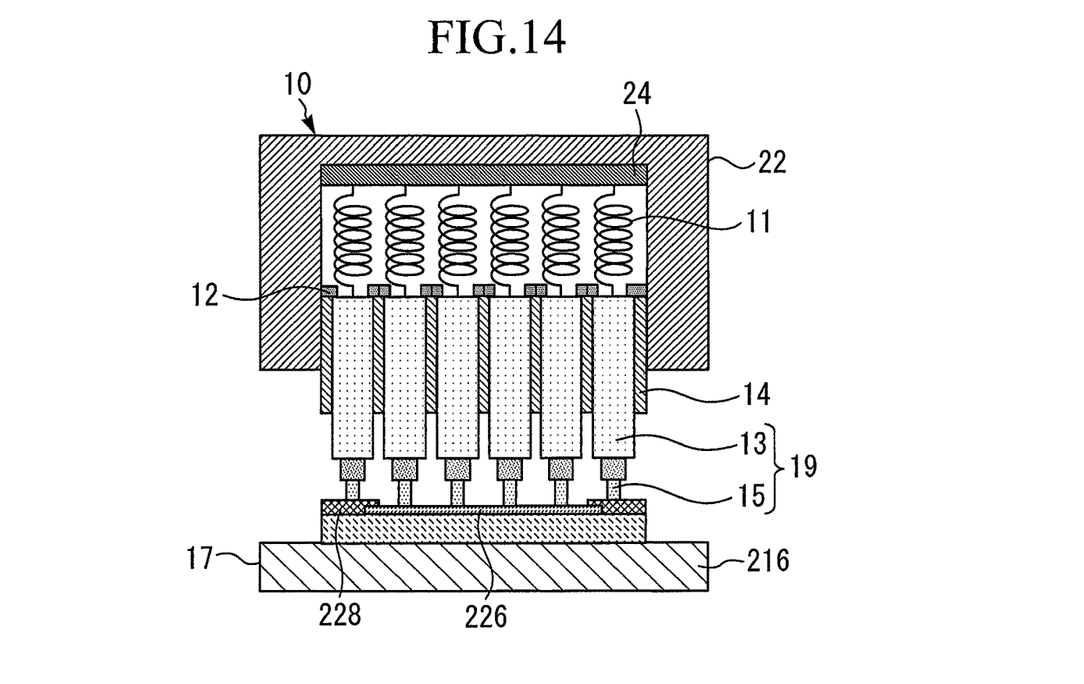
FIG. 14 is a diagram showing a contacting step according to the third embodiment.

FIG. 13 is a diagram showing a fixing step according to the third embodiment. The fixing step is the same as the first embodiment. FIG. 14 is a diagram showing a contacting step according to the third embodiment. In the contacting step, some of the plural contact probes 19 are in contact with an insulating film 228. Some of the plural contact probes 19 are in contact with an electrode portion 226. Next, a measuring step is executed. The measuring step is the same as in the first embodiment. However, in the present embodiment, the contact probes 19 do not contact the lower jig 17. Therefore, no short-circuit state occurs.

Figure 15:
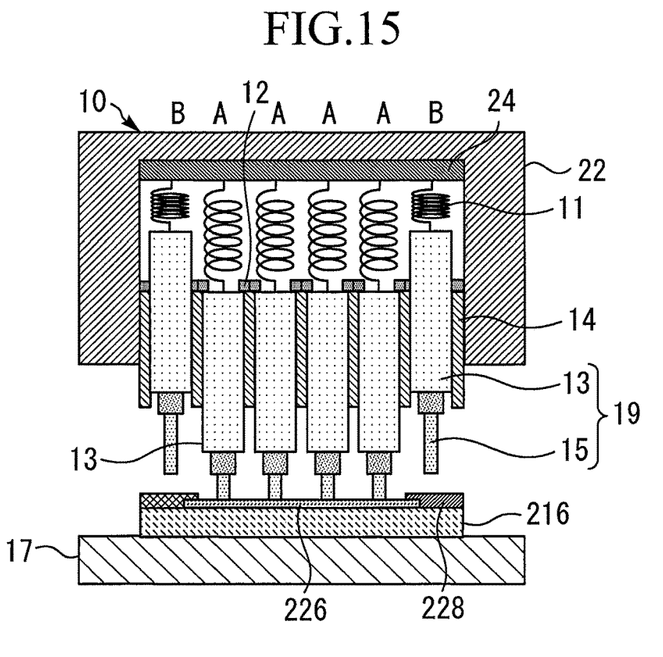
FIG. 15 is a diagram showing a switching step according to the third embodiment.
Figure 16:
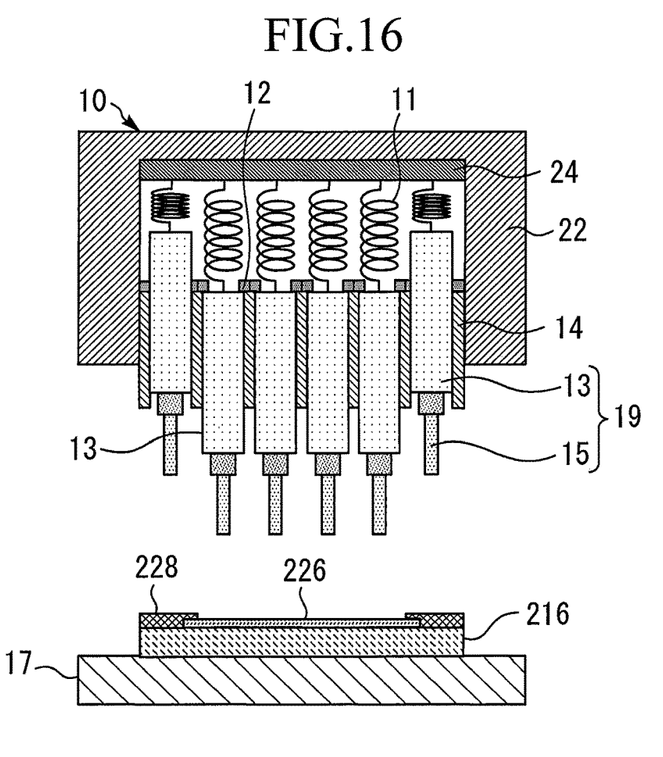
FIG. 16 is a diagram showing the inspection device for which a pin arrangement has been set.

Next, a switching step is executed. FIG. 15 is a diagram showing the switching step according to the third embodiment. In the switching step, the fixing portion 12 of a contact probe 19 which is allocated to the region B in accordance with the current-voltage characteristic obtained in the measuring step is set to the releasing state. From the foregoing, the inspection device 10 is set in the pin arrangement corresponding to a chip layout. FIG. 16 is a diagram showing the inspection device for which the pin arrangement has been set. In FIGS. 13 to 16, the controller 40 and the wirings 20, 21, and 41 are omitted.

Note that the technical features described in the above embodiments may be combined as appropriate.

REFERENCE SIGNS LIST 10,110 inspection device, 24 fixing plate, 11 expanding and contracting portion, 19 contact probe, 12 fixing portion, 17 lower jig, 32,132 measuring circuit, 150 reference probe, 40 controller, 16,216 inspection target

The invention claimed is:

1. An inspection device comprising:
a fixing plate;
a plurality of expanding and contracting portions that are fixed to the fixing plate at one ends thereof;
a plurality of contact probes that are fixed to the other ends of the plurality of expanding and contracting portions respectively; and
a plurality of fixing portions that are provided to the plurality of contact probes respectively, wherein
each of the fixing portions performs switching between a fixing state where an upper end of a corresponding contact probe out of the plurality of contact probes is fixed at a first position and a releasing state where the contact probe is not fixed,
the contact probe is pulled to the fixing plate by a corresponding expanding and contracting portion out of the plurality of expanding and contracting portions under the fixing state, and
the upper end of the contact probe is placed at a second position closer to the fixing plate than the first position under the releasing state.

2. The inspection device according to claim 1, wherein the plurality of contact probes have elasticity, and
lower ends of the plurality of contact probes under a contracted state that are fixed at the first position at the upper ends thereof are placed at a lower position than lower ends of the plurality of contact probes under an expanded state that are placed at the second position at the upper ends thereof.

3. The inspection device according to claim 1, further comprising:
a lower jig arranged below the plurality of contact probes; and
a measuring circuit for measuring a current-voltage characteristic between each of the plurality of contact probes and the lower jig.

4. The inspection device according to claim 1, wherein one of the plurality of contact probes is a reference probe, and
the inspection device further comprises a measurement circuit for measuring a current-voltage characteristic between the reference probe and each of the plurality of contact probes other than the reference probe.

5. The inspection device according to claim 1, further comprising a controller for switching each of the plurality of fixing portions from the fixing state to the releasing state.

6. The inspection device according to claim 3, further comprising a controller for switching each of the plurality of fixing portions from the fixing state to the releasing state, wherein
the controller selects a fixing portion to be switched from the fixing state to the releasing state among the plurality of fixing portions according to the current-voltage characteristic.

7. The inspection device according to claim 6, wherein the controller stores the current-voltage characteristic, reads out a stored current-voltage characteristic, and selects a fixing portion to be switched from the fixing state to the releasing state among the plurality of fixing portions.

8. The inspection device according to claim 1, wherein the plurality of expanding and contracting portions are formed of rubber.

9. The inspection device according to claim 1, wherein the plurality of expanding and contracting portions have electric conductivity.

10. The inspection device according to claim 3, wherein the lower jig has a spring probe or a wire probe.

11. An inspection method comprising:
a step of preparing an inspection device including:
a fixing plate;

a plurality of expanding and contracting portions that are fixed to the fixing plate at one ends thereof;

a plurality of contact probes that are fixed to the other ends of the plurality of expanding and contracting portions respectively; and a plurality of fixing portions that are provided to the plurality of contact probes respectively, each of the fixing portions performing switching between a fixing state where an upper end of a corresponding contact probe out of the plurality of contact probes is fixed at a first position and a releasing state where the contact probe is not fixed;

a fixing step of setting the plurality of fixing portions to the fixing state;

a contacting step of bringing the plurality of contact probes into contact with an inspection target after the fixing step;

a measuring step of measuring a current-voltage characteristic of each of the plurality of contact probes while the plurality of contact probes are brought into contact with the inspection target;

a switching step of selecting a fixing portion to be switched from the fixing state to the releasing state among the plurality of fixing portions according to the current-voltage characteristic, and switching the selected fixing portion from the fixing state to the releasing state; and an inspection step of bringing the plurality of contact probes into contact with the inspection target and performing inspection after the switching step, wherein the contact probe is pulled to the fixing plate by a corresponding expanding and contracting portion out of the plurality of expanding and contracting portions under the fixing state, the upper end of the contact probe is placed at a second position closer to the fixing plate than the first position under the releasing state, the contact probe whose upper end is fixed at the first position contacts the inspection target with elastic force, and the contact probe whose upper end is placed at the second position does not contact the inspection target.

12. The inspection method according to claim 11, wherein the inspection device includes a lower jig on which the inspection target is mounted, and in the measuring step, the current-voltage characteristic between each of the plurality of contact probes and the lower jig is measured.

13. The inspection method according to claim 12, wherein in the switching step, a fixing portion provided in a contact probe that is determined to be in a short-circuited state or an open state from the current-voltage characteristic among the plurality of contact probes is switched to the releasing state.

14. The inspection method according to claim 11, further comprising a step of selecting a reference probe from the plurality of contact probes, wherein in the measuring step, a current-voltage characteristic between the reference probe and each of the plurality of contact probes other than the reference probe is measured.

15. The inspection method according to claim 14, wherein in the switching step, a fixing portion provided in a contact probe that is determined to be in an open state from the current-voltage characteristic among the plurality of contact probes is switched to the releasing state.

16. The inspection method according to claim 11, wherein a lower jig on which the inspection target is mounted is provided, and in the contacting step, at least one of the plurality of contact probes contacts the lower jig.

17. The inspection method according to claim 11, further comprising a step of setting the plurality of fixing portions to the releasing state after the inspection step.

* * * * *